United States Patent [19]

Kumar

[11] Patent Number: 5,436,540
[45] Date of Patent: Jul. 25, 1995

[54] PROTECTION CIRCUIT FOR A GATE TURN-OFF DEVICE IN AN ELECTRICAL BRAKING SYSTEM FOR AN ELECTRIC TRACTION MOTOR VEHICLE

[75] Inventor: Ajith K. Kumar, Erie, Pa.

[73] Assignee: General Electric Company, Erie, Pa.

[21] Appl. No.: 242,765

[22] Filed: May 16, 1994

[51] Int. Cl.⁶ .................... H02P 3/12; H02H 7/122
[52] U.S. Cl. .................... 318/375; 318/139; 361/18; 363/50; 363/124
[58] Field of Search .............. 318/139, 362, 375, 376; 361/18, 23, 55, 56, 91, 100; 363/39, 50, 123, 124

[56] References Cited

U.S. PATENT DOCUMENTS

| | | |
|---|---|---|
| 3,890,551 | 6/1975 | Plunkett . |
| 4,093,900 | 6/1978 | Plunkett . |
| 4,275,430 | 6/1981 | Seki et al. . |
| 4,697,219 | 9/1987 | Mitsuoka . |
| 4,745,513 | 5/1988 | McMurray . |
| 4,761,600 | 8/1988 | D'Atre et al. . |
| 4,904,918 | 2/1990 | Bailey et al. . |
| 5,117,166 | 5/1992 | Kumar . |
| 5,208,741 | 5/1993 | Kumar . |
| 5,283,507 | 2/1994 | Stitt et al. . |
| 5,331,261 | 7/1994 | Brown et al. . |

*Primary Examiner*—Bentsu Ro
*Attorney, Agent, or Firm*—Jill M. Breedlove; Marvin Snyder

[57] ABSTRACT

A snubber circuit for limiting an initial voltage applied to a semiconductor switching device during transition of the switching device from a conducting to a non-conducting state includes a first circuit having a serially connected first diode and first capacitor coupled in parallel with the switching device and a second circuit having a second capacitor having a second capacitor connected between a cathode terminal of the switching device and a voltage potential less than a potential switched through the switching device and further having a second diode and a serially connected inductor coupled between the anode terminal of the switching device and the lower voltage potential. The voltage appearing at the cathode terminal of the switching device in excess of the lower voltage potential will effect a current through the inductor to limit an initial voltage rise at the cathode terminal when switching the device to a non-conducting state.

7 Claims, 2 Drawing Sheets

PROTECTION CIRCUIT FOR A GATE TURN-OFF DEVICE IN AN ELECTRICAL BRAKING SYSTEM FOR AN ELECTRIC TRACTION MOTOR VEHICLE

This invention relates to electric power systems for electrically propelled vehicles and, more particularly, to a system for protecting solid state switching devices from high-voltage during transitioning from conducting to non-conducting states.

BACKGROUND OF THE INVENTION

Electric traction motor vehicles, such as locomotives, transit vehicles or off-highway vehicles, use power conversion systems to condition the electric power supplied to electric motors during propulsion and to control regenerative power from the motors during electrical retarding. If supplying DC motors, such a system will include an electric power "chopper" that is suitably controlled to vary the magnitude of load current and/or voltage as desired. Alternatively, in the case of alternating current (AC) motors, the system will include an electric power "inverter" that is suitably controlled to vary the amplitude and frequency of load voltage as desired. In either case, electric power flows from the DC source terminals to the load terminals of the controllable converter during "motoring" operation or in a reverse direction during "electrical braking".

In the electrical braking or retarding mode of operation of the power conversion system, the converter is so controlled that each motor acts as a generator driven by the inertia of the vehicle and supplies electric power which flows in a reverse direction through the converter and appears as direct and unipolarity voltage at the source terminals. As this electrical energy is used or dissipated, the traction motor(s) responds by absorbing kinetic energy and slowing the vehicle. Electrical braking is achieved by dynamic braking. Dynamic braking is effected by connecting a dynamic braking resistance between the DC source terminals. This resistance receives current from the converter, converts the electrical energy to thermal energy, and dissipates the resulting heat.

A power conversion system including a voltage source inverter for supplying AC traction motors is disclosed in U.S. Pat. No. 3,890,551—Plunkett, assigned to General Electric Company. A shunt capacitance (C) of a filter at the DC terminals of the inverter provides the "stiff" voltage required for proper operation of a voltage source inverter.

U.S. Pat. No. 4,093,900, assigned to General Electric Company, shows an exemplary dynamic brake circuit, although in the present state-of-the-art, it is preferable to replace the parallel array of separate braking resistors and their respectively associated electromechanical switches, as shown in U.S. Pat. No. 4,093,900, with a single bank of resistance elements connected to the DC link via an electric power chopper comprising a controllable solid-state electric valve that can be repetitively turned on and off in a pulse width modulation (PWM) mode to control the average magnitude of current in the resistor as desired. An example of this practice is disclosed in U.S. Pat. No. 4,761,600—D'Atre et .al., where the electric valve comprises a main thyristor for commutating the main SCR from a conducting state (on) to a non-conducting or current blocking state (off). Preferably, a solid-state gate turn-off device (GTO) could be substituted for the chopper shown in U.S. Pat. No. 4,761,600.

The filter capacitance means operates in conjunction with the electrical braking system. A more detailed description of the operation of an electrical braking system may be had by reference to U.S. Pat. No. 4,904,918—Bailey et al., issued Feb. 27, 1990 and assigned to the assignee of the present invention. During electrical braking, the capacitance means is called upon to attenuate transients generated by the operation of the chopper in varying the dynamic braking resistance so as to provide smooth braking effort.

In a typical system operated in a dynamic braking mode, the voltage appearing across the filter capacitance may be on the order of 1400 volts. During switching of the chopper circuit, the switching devices, such as GTO devices, must be capable of transitioning to a non-conducting state even though such high voltages are present. In a conventional system, a GTO device is protected by a snubber circuit which delays application of the full voltage to the GTO device until the device has sufficient time to reach a blocking state. Application of the full voltage prior to the GTO device reaching the blocking state may prevent the GTO device from turning off and result in an uncontrolled mode of operation. Further, the energy stored in the stray inductance in the dynamic braking circuit gets transferred to the snubber circuit during turn-off of the GTO device. The amount of this energy determines the peak voltage applied to the GTO device during turn-off. This voltage, along with the decay current in the GTO device, determines the switching losses in the GTO device.

It is obviously desirable to minimize the peak voltage and losses in the GTO device. One solution would be to keep the inductance between the filter capacitor and the GTO device at a low value. However, for practical reasons, the circuit inductance cannot be lowered sufficiently, particularly when additional elements such as brake cut-out switches are included in the circuit. Another possibility is to place capacitors in parallel circuit with the dynamic brake resistance and GTO switches. However, this solution produces circulating currents through the stray inductance, the DC filter or link capacitance, and the parallel capacitors, and for that reason is an impractical solution.

SUMMARY OF THE INVENTION

Among the several objects of the present invention may be noted the provision of an improved snubber circuit for a dynamic brake GTO device in an electric traction motor vehicle in which the snubber circuit reduces voltage overshoot at GTO device turn-off, reduces GTO device switching losses, reduces power loss in the snubber circuit and enables higher peak turn-off current rating for the GTO device.

In an exemplary embodiment, the snubber circuit is implemented in a dynamic brake circuit for a traction vehicle in which at least one GTO device is coupled in series circuit with at least a pair of serially connected dynamic brake resistors. The dynamic brake circuit is connected across a DC link extending between a DC power source and an inverter coupled to electric traction motors. A filter or DC link capacitor is coupled across the DC link to reduce ripple currents and switching transients. During electrical braking, the inverter is so controlled as to cause regenerative current produced by the motors acting as brakes to pass in a reverse direction through the inverter to the DC link. The magnitude of braking effort is regulated by control of the DC link voltage, which control is effected by coupling the dynamic brake resistors to the DC link to dissipate the energy from the motors by conversion to heat. The GTO device regulates current through the resistors so that the resistors appear as a variable, controlled heat dissipation load.

In regulating current through the dynamic brake circuit, the GTO device is gated between conductive and non-conductive states. When gated to a conductive state, the stray inductance is beneficial in allowing current to build to a maximum value at a reasonable rise time. When the GTO device is gated to a nonconductive state, the stray inductance causes current to continue. A snubber circuit is connected across the GTO device to provide a bypass current path while the GTO device is commutated. In the present invention, the snubber circuit includes a first portion having a first diode and a first capacitor serially connected in parallel with the GTO device, the first diode being poled in the same direction as the GTO device. A discharge resistor is coupled in parallel with the first diode for dissipating charge on the capacitor.

A second portion of the snubber circuit includes a second capacitor coupled between a cathode of the GTO device and a terminal intermediate the pair of braking resistors. A second diode and an inductor are serially connected between an anode of the GTO device and the terminal mediate the braking resistors.

When the GTO device is conducting, the second capacitor charges to a voltage set by the relative value of the pair of braking resistors which is preferably one-half the DC link voltage. When a gate signal is applied to turn off the GTO device, current initially transitions into the first capacitor. After several milliseconds, the first capacitor charges to a voltage above one-half the DC link voltage and a second current path is then established through the second diode and inductor to the second capacitor. Additional time is then required to charge the second capacitor to the DC link voltage. The result is a two-stage voltage build-up at the GTO device which is delayed sufficiently to allow the device to reach its blocking state prior to application of full voltage. Further, the first capacitor can be a small value so that minimum energy must be dissipated in the discharge resistor during the next turn-on of the GTO device. The second capacitor discharges through one of the braking resistors and can therefore have a larger value than the first capacitor.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
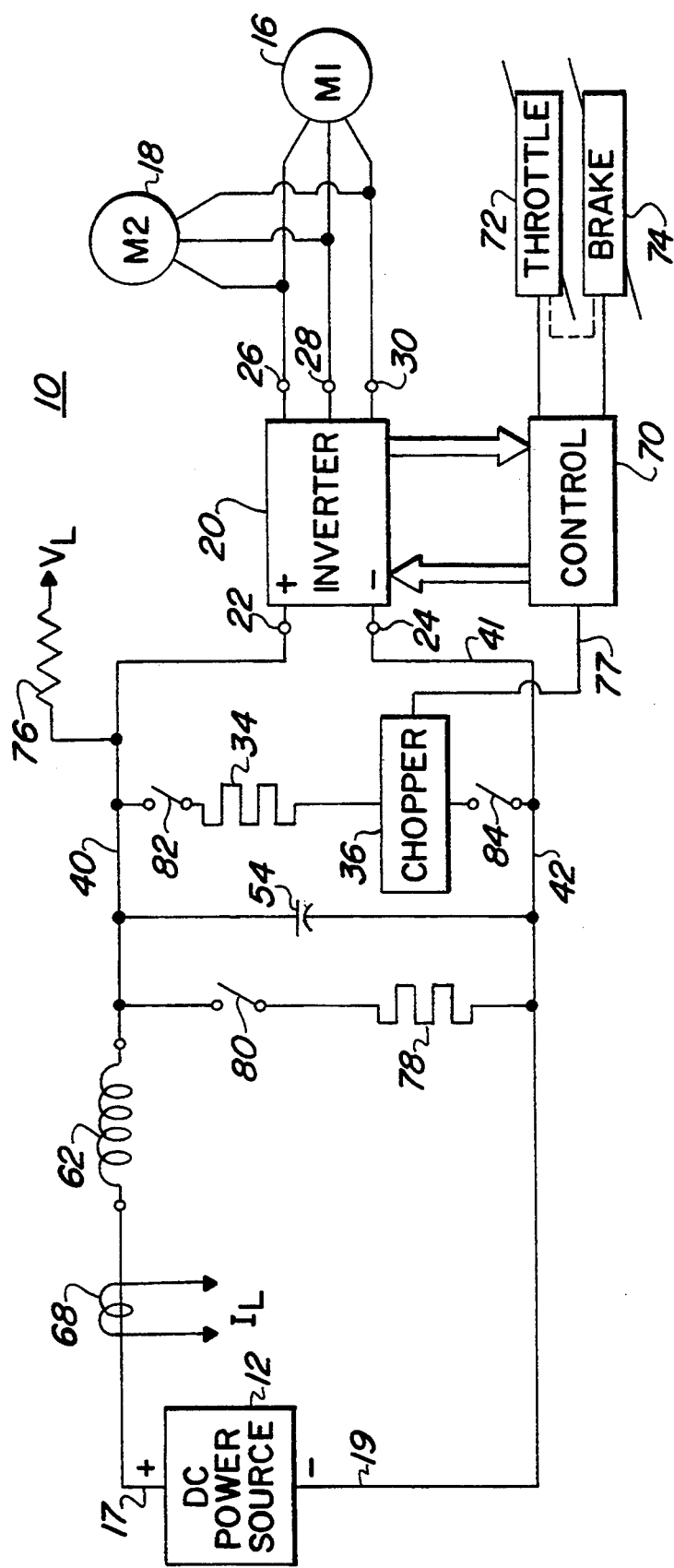
FIG. 1 is a simplified partial schematic, partial block diagram of a power conversion system for a traction vehicle.

Referring now to FIG. 1, there is shown a power conversion system 10 for conveying power between a DC power source 12 and an electric load comprising first and second motors 16 and 18 electrically connected in parallel. In one application of the invention, the motors 16 and 18 are three-phase AC induction-type traction motors used for propelling a traction vehicle, such as a locomotive (not shown), and the DC source 12 comprises a diesel engine driven alternator, a rectifier and DC voltage regulator. In FIG. 1, a relatively positive voltage is developed on line 17 and a reference ground is established on line 19. The magnitude of the unipolarity voltage between the lines 17 and 19 is typically in a range from 600 volts normal to 1400 volts maximum. Each of the motors 16 and 18 typically has a full-load rating on the order of 1000 horsepower more or less.

The power conversion system 10 includes a controllable converter 20 which, in the illustrated embodiment of the invention, is a voltage source inverter having a pair of DC terminals 22 and 24 on its source side and a set of three AC terminals 26, 28, and 30 on its motor side. The DC terminal 22 is connected via a conductor 40 to the lines 17 of the positive potential, and the terminal 24 is connected via relatively negative conductors 41 and 42 to the other lines 19 of the DC power source 12. The conductors 40–42 thus serve as a DC link between the source 12 and the inverter 20. The AC terminals 26, 28, and 30 are respectively connected to the three different phases of each of the AC motors 16 and 18.

During motoring, i.e., when electrical power is being conveyed from the source to the motors, direct current is supplied to the inverter through its DC terminals 22 and 24, and the inverter acts to convert this direct current into alternating current supplied through AC terminals 26, 28, and 30 to the motors 16 and 18. The inverter is of a conventional design and includes suitable controls (not shown in FIG. 1) for varying the amplitude and frequency of the alternating voltage at its AC terminals to provide the needed acceleration or deceleration of the vehicle driven by the motors 16 and 18. The well known pulse width modulated (PWM) control strategy can be used. Examples of useful inverters are disclosed in U.S. Pat. Nos. 3,890,551 and 4,761,600. In modern practice, GTO devices are preferred as the main controllable electrical valves of the inverter, thereby avoiding the need for auxiliary thyristors and commutation circuits. The power conversion system 10 has alternative motoring and electrical braking modes of operation. During electrical braking, each of the motors 16 and 18 operates as an electrical generator driven by the inertia of the vehicle, returning power to the system 10. This return power flows through the inverter 20 in a reverse direction from the direction of flow during motoring and appears as a unipolarity voltage and direct current at the DC terminals 22 and 24.

The conversion system 10 is designed to provide for dynamic braking. Dynamic braking is effected by connecting across the conductors 40 and 42 of the DC link a dynamic braking resistance 34 through which at least some of the braking current can be made to flow, thus dissipating electric energy in the form of heat. For controlling current in the resistance 34, an electric power chopper 36 is connected in series therewith. As is well known to persons skilled in the art, the chopper 36 is a solid-state switch that can be repetitively turned on and off by suitable control means (not shown in FIG. 1) that, in one form, controls the ratio of the "on time" to the "off time" of the switch during successive intervals each of fixed duration. The average magnitude of current in the resistance varies directly with this ratio.

For attenuating harmonics generated by operation of the power conversion system 10 and for effectively isolating the system from any undesirable electrical transients in the DC power source 12, a single-stage electrical filter of the L-C type is included in the connections between the source 12 and the inverter 20. This filter comprises a series line-filter inductance means 62 connected in the path of current between the line 17 and the positive conductor 40 of the DC link, and shunt capacitance means 54, which comprises two separate parallel banks of capacitors. The capacitance means 54 (referred to as the DC link capacitor) spans the conductors 40 and 42 and thus is directly connected between the two DC terminals 22 and 24 of the inverter.

The L-C filter serves to attenuate harmonics generated by operation of the inverter 20 so that such harmonics are isolated from the DC source 12. During motoring, the DC link capacitor 54 serves mainly as the required "stiff" voltage source for the inverter 20. In the electrical braking mode of operation, the capacitor 54 serves mainly as a filter for the chopper 36, providing a temporary path for braking current during the off periods of the chopper in the dynamic braking circuit 34, 36 which, as can be seen in FIG. 1, is connected across the capacitor 54. In addition to attenuating chopper-generated harmonics, the L-C filter dampens the inverter-generated harmonics during electrical braking.

Current to the propulsion system is monitored by a current monitor 68 of a type well known in the art. Monitor 68 generates a signal IL representative of the magnitude and frequency of current in the DC conductor 40. The voltage at DC link conductor 40 is indicated by signal VL obtained through buffer resistor 76 connected to conductor 40.

The filter capacitance means 54 can be discharged through discharge resistance means 78 via discharge contactor 80. The discharge of capacitance means 54 may be desirable for safety during maintenance.

The inverter 20 is controlled from a control means 70 which responds to alternative command signals from interlocked throttle and brake controllers 72 and 74, respectively. The control means 70 also receives feedback signals representative of sensed values of voltage, current, and other selected variables of the inverter 20. To operate in a dynamic braking mode, the control means 70 derives a train of suitably timed periodic signals that determine the repetitive on and off intervals of the chopper 36 and varies the ratio of these intervals as desired. This signal train is fed over a line 77 to the chopper 36. A detailed description of chopper circuits for dynamic braking in an electric power conversion system is shown in U.S. Pat. Nos. 5,208,741 and 5,117,166, the disclosures of which are incorporated by reference herein.

In the illustrative system, a system microcomputer, which may be part of the control 70 monitors the line voltage from DC power source 12, the filter voltage at the DC link conductor 40, and also the current IL into the DC link conductor 40. In response to the monitored voltage and current and to system operating commands, the system microcomputer controls the filter discharge contactor 80 and provides commands to the dynamic brake chopper 36 for enabling dynamic braking of the vehicle. The dynamic brake chopper 36 includes its own microcomputer for controlling the on and off operation of the gate turn off (GTO) devices within the chopper. The chopper microcomputer is also responsive to the measured filter voltage at link conductor 40 for controlling the time ratio of conduction of the gate turn off devices. The control 70 also controls operation of dynamic brake cut-out switches 82,84 which can isolate the dynamic brake circuit from the system 10.

Figure 2:
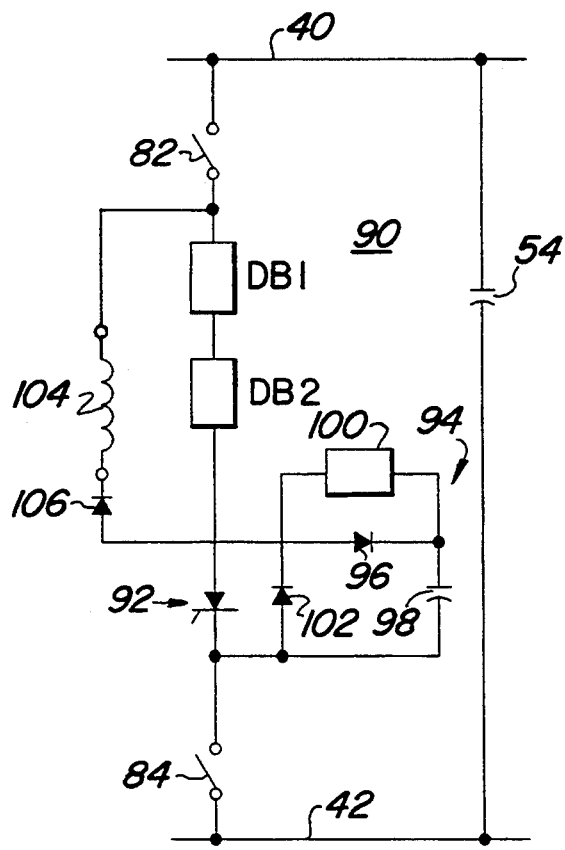
FIG. 2 is a simplified schematic diagram of a prior art dynamic brake chopper system used in the control of the system of FIG. 1.

Turning now to FIG. 2, there is shown one form of dynamic brake circuit 90 of the prior art. During normal vehicle operation, switches 82,84 are closed placing the brake circuit across the link capacitor 54. For purposes of illustration, the brake resistance is shown as a pair of resistors DB1 and DB2 although it will be understood that each resistor DB1, DB2 may comprise several series and/or parallel resistance elements. The chopper circuit 36 comprises at least one gate turn-off (GTO) device 92 although in a practical system several devices may be connected in parallel. A snubber circuit 94, comprising serially connected diode 96 and capacitor 98, is coupled across device 92 with diode 96 poled to carry current in the same direction as device 92. A discharge resistor 100 is connected in parallel with diode 96 and a reversely poled diode 102 is connected across device 92. Finally, the series combination of inductor 104 and diode 106 is connected between an anode of device 92 and the connection between resistance DB1 and switch 82.

In the operation of the circuit of FIG. 2, turn-on of GTO device 92 allows any charge accumulated on capacitor 98 to discharge through resistor 100. Since capacitor 98 is relatively small, typically 3–4 microfarads (MFD), the amount of stored energy is small and the resistor 100, typically about 5 ohms, can be relatively low power. However, because of the small size of capacitor 98, and the low ohmic value of DB1, DB2 (about 1 ohm) and low inductance of inductor 104 (about 6 microhenry), its charge time is very rapid, e.g., in the order of 10–20 microseconds. Since GTO devices of a size used in dynamic brake circuits require more than 20 microseconds to fully turn-off, application of the full link voltage to the device increases switching losses and requires devices with higher peak current turn-off ratings. The diode 106 and inductor 104 reduce voltage overshoot above link voltage since diode 106 will begin to conduct when the voltage at the anode of device 92 rises above link voltage, i.e., the voltage on capacitor 54.

Figure 3:
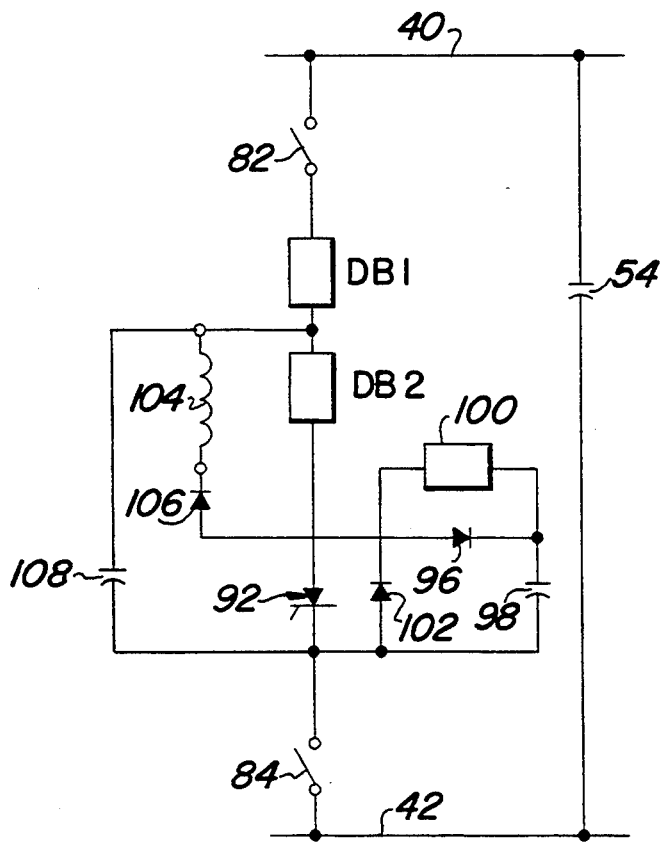
FIG. 3 is a simplified schematic diagram of an improved dynamic brake chopper system in accordance with the present invention.

A simplified schematic representation of one form of the present invention is illustrated in FIG. 3. The snubber circuit 94 if FIG. 2 is modified to incorporate a second capacitor 108 connected between a cathode of GTO device 92 and a terminal intermediate the pair of dynamic brake resistors DB1, DB2. In addition, the overshoot inhibit circuit comprising diode 106 and inductor 104 is now connected between the anode of device 92 and the terminal to which capacitor 108 is connected between resistors DB1, DB2. The capacitor 108 is selected to have a much larger capacitance value than capacitor 98. For example, capacitor 108 may be about 50 MFD. Of course, this is still small with respect to link capacitor 54 which may be in the range of 10,000 MFD.

Now, when GTO device 92 receives a gate turn-off command, its anode voltage rises rapidly (within 10–20 microseconds) to the voltage appearing intermediate resistors DB1, DB2 which is preferably one-half the link voltage since DB1 is preferably equal in value to DB2. At this one-half voltage threshold, diode 106 begins to conduct and current transfers through inductor 104 to charge capacitor 108 toward the link voltage. Assuming that dynamic braking is in operation and that the link voltage is 1400 volts, the voltage intermediate resistors DB1, DB2 will be about 700 volts. When device 92 is gated for turn-off, capacitor 98 will begin to charge and within about 20 microseconds will reach about 700 volts. The reactance of inductor 104 will delay current transfer through diode 106 causing a slight overshoot of the voltage above 700 volts at the anode of device 92. As the current transfers, the overshoot rise time is slowed as capacitor 108 begins to charge from 700 volts toward 1400 volts. Because capacitor 108 is larger, the rise time to 1400 volts takes about 60–70 microseconds. Within this additional time, device 92 reaches its full blocking capability. Although a second overshoot occurs when capacitor 108 becomes fully charged, the GTO device 92 is then in its off state and can withstand the higher voltage without associated losses.

The modified circuit of FIG. 3 has less overshoot during the turn-off time of the GTO device and turns off the GTO device under lower voltage with less switching loss. The improved snubber circuit has lower snubber losses and higher peak turn-off current rating. When the GTO device 92 is gated into conduction on the next cycle, the capacitor 98 discharges through resistor 100. However, capacitor 108 discharges through braking resistor DB2. Since resistor DB2 is designed to handle high current and dissipate large amounts of heat, the use of the large capacitor 108 does not adversely affect the snubber circuit heat dissipation as would be the case if capacitor 98 were made large and resistor 100 was required to handle the heat dissipation.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A dynamic braking circuit for an electrically propelled vehicle having at least one electric traction motor operable in an electrical retarding mode, the magnitude of electrical retarding being at least partially controlled by a braking circuit comprising:

braking resistance means, having a first end, a second end and at least one terminal intermediate said first and second ends;

a gate turn-off (GTO) device serially connected to said braking resistance means, said GTO device and said braking resistance means being connected in circuit with said at least one electric traction motor;

a snubber circuit connected in parallel circuit arrangement with said GTO device, said snubber circuit comprising:

a first circuit connected in parallel circuit arrangement with said GTO device and including a first capacitor in series with a first diode connected between anode and cathode of said GTO device, said first diode being poled in the same polarity as said GTO device, and further including a resistor connected in parallel with said first diode and a second diode connected in reverse polarity between said anode and said cathode of said GTO device; and a second circuit including a second capacitor connected between said cathode of said GTO device and said at least one terminal intermediate said ends of said resistance means, and further including inductance means serially connected with a third diode between said at least one terminal and said anode of said GTO device for establishing a first voltage limit during turn-off of said GTO device.

2. The braking circuit of claim 1 wherein said at least one terminal is positioned at a midpoint between said first and said second ends of said resistance means.

3. The braking circuit of claim 2 and including a filter capacitance means connected in parallel circuit arrangement with the serial combination of said resistance means and said GTO device, a voltage appearing at said at least one terminal being one-half of a voltage on said filter capacitance means when said GTO device is in a conducting state.

4. A snubber circuit for limiting an initial voltage applied to a semiconductor switching device during transition of the switching device from a conducting to a non-conducting state, the snubber circuit comprising:

a first circuit comprising a serially connected first diode and first capacitor coupled in parallel with the switching device, said diode being poled to conduct current in the same direction as the switching device whereby switching of the switching device to a non-conducting state will cause said capacitor to charge through said diode;

a second circuit comprising a second capacitor having a first terminal connected to a cathode terminal of the switching device and a second terminal connected to a voltage potential less than a potential switched through the switching device, a second diode and a serially connected inductor coupled between an anode terminal of the switching device and the second terminal of said second capacitor, whereby voltage appearing at said cathode terminal of the switching device in excess of the voltage potential on said second capacitor will effect a current through said inductor to limit an initial voltage rise at said cathode when switching the switching device to a non-conducting state.

5. The snubber circuit of claim 4 wherein the switching device is connected in series circuit with at least a pair of serially connected resistors, the second terminal of said second capacitor being connected to a terminal intermediate said pair of resistors.

6. The snubber circuit of claim 5 and including a filter capacitor connected in parallel with the series combination of said pair of resistors and the switching device.

7. The snubber circuit of claim 5 wherein the said switching device comprises a gate turn-off thyristor.

* * * * *